United States Patent
Tsai

(10) Patent No.: US 8,171,335 B2
(45) Date of Patent: May 1, 2012

(54) CLOCK TIMING CALIBRATION CIRCUIT AND CLOCK TIMING CALIBRATION METHOD FOR CALIBRATING PHASE DIFFERENCE BETWEEN DIFFERENT CLOCK SIGNALS AND RELATED ANALOG-TO-DIGITAL CONVERSION SYSTEM USING THE SAME

(75) Inventor: Jen-Che Tsai, Taichung County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 418 days.

(21) Appl. No.: 12/479,877

(22) Filed: Jun. 8, 2009

(65) Prior Publication Data
US 2010/0066422 A1    Mar. 18, 2010

Related U.S. Application Data

(60) Provisional application No. 61/097,528, filed on Sep. 16, 2008.

(51) Int. Cl.
*G06F 1/04* (2006.01)
(52) U.S. Cl. .................. 713/503; 713/600; 327/156
(58) Field of Classification Search .......... 713/500–600; 327/156
See application file for complete search history.

(56) References Cited

U.S. PATENT DOCUMENTS

| | | | | |
|---|---|---|---|---|
| 5,909,130 A * | 6/1999 | Martin et al. | ................... | 327/12 |
| 6,918,050 B2 * | 7/2005 | Yoshikawa et al. | ........... | 713/503 |
| 7,034,592 B2 * | 4/2006 | Saeki | ............................ | 327/163 |
| 7,236,026 B1 * | 6/2007 | Samad et al. | .................. | 327/156 |
| 7,412,617 B2 * | 8/2008 | Chang | ............................ | 713/503 |
| 7,472,305 B1 * | 12/2008 | Hershman et al. | ............ | 713/500 |
| 7,526,054 B2 * | 4/2009 | Doyle et al. | .................. | 375/355 |
| 2002/0021163 A1 * | 2/2002 | Manning | ....................... | 327/534 |
| 2004/0091096 A1 * | 5/2004 | Chen et al. | .................... | 379/300 |

* cited by examiner

*Primary Examiner* — Brian Misiura
*Assistant Examiner* — Kim Huynh
(74) *Attorney, Agent, or Firm* — Winston Hsu; Scott Margo

(57) ABSTRACT

A clock timing calibration circuit includes a clock timing adjusting unit and a calibration control unit. The clock timing adjusting unit is for receiving an incoming reference clock signal and selectively adjusting the received reference clock signal to generate a first clock signal according to a calibration control signal. The incoming reference clock has a predetermined phase and a predetermined frequency. The calibration control unit is for checking if the phase difference between the first clock signal and a second clock signal satisfies a predetermined criterion, and for adjusting the calibration control signal when the phase difference between the first clock signal and the second clock signal does not satisfy the predetermined criterion. The predetermined criterion is to check if the phase difference falls within a specific range associated with a clock period of one of the first clock signal and the second clock signal.

18 Claims, 9 Drawing Sheets

CLOCK TIMING CALIBRATION CIRCUIT AND CLOCK TIMING CALIBRATION METHOD FOR CALIBRATING PHASE DIFFERENCE BETWEEN DIFFERENT CLOCK SIGNALS AND RELATED ANALOG-TO-DIGITAL CONVERSION SYSTEM USING THE SAME

CROSS REFERENCE TO RELATED APPLICATIONS

This application claims the benefit of U.S. provisional application No. 61/097,528, filed on Sep. 16, 2008, and incorporated herein by reference.

BACKGROUND

The present invention relates to clock timing calibration, and more particularly, to a clock timing calibration and clock timing calibration method for calibrating a phase difference between different clock signals (e.g., clock signals of a quantizer and digital-to-analog converters included in a continuous-time delta-sigma analog-to-digital converter) and related analog-to-digital conversion system using the same.

Delta-sigma analog-to-digital converters (ADCs) which use the delta-sigma modulation technique are commonly implemented in a variety of applications. For example, in a wireless communication transceiver, a continuous-time delta-sigma ADC is employed. FIG. 1 shows a diagram illustrating a conventional continuous-time delta-sigma ADC. The conventional continuous-time delta-sigma ADC 100 includes an adder 102 for subtracting an analog feedback signal A_FB from an analog input signal A_IN, a loop filter 104 (e.g., an integrator) for performing noise-shaping upon an output of the adder 102, a quantizer 106 (e.g., an ADC) for converting an output of the loop filter 104 into a digital output D_OUT with a quantization error added thereto, and a digital-to-analog converter (DAC) 108 for converting the digital output D_OUT into the analog feedback signal A_FB. In addition, the quantizer 106 is operated according to a quantizer clock signal CLK_1, and the DAC 108 is operated according to a DAC clock signal CLK_2.

Generally speaking, the conventional continuous-time delta-sigma ADC 100 has stringent requirement on excess loop delay. For example, the quantizer 106 has intrinsic delay on performing the quantization operation. In order to reduce the influence of the excess loop delay, a delay with one clock period could be introduced to the feedback loop between the quantizer clock signal CLK_1 and the DAC clock signal CLK_2. Please refer to FIG. 2, which shows a diagram illustrating another conventional continuous-time delta-sigma ADC. The continuous-time delta-sigma ADC 200 has a feedback delay stage 201 conceptually included therein to relax the excess loop delay problem mentioned above. The feedback delay stage 201 is schematically modeled between the output of the quantizer 106 and the input of the DAC 108. In an actual implementation, the feedback delay stage 201 is generally realized by delaying the quantizer clock timing with respect to the DAC clock timing by one clock period. As shown in FIG. 2, due to the implementation of the conceptual feedback delay stage 201 realized using clock timing adjustment, a compensation circuit (i.e., the DAC 208) is therefore needed to provide feedback compensation to the output of the loop filter 104. Specifically, before the output of the loop filter 104 is fed into the quantizer 106, the adder 202 disposed between the loop filter 104 and the quantizer 106 subtracts the feedback compensation generated from the DAC 208 from the output of the loop filter 104. As the operation and function of the DAC 208 which serves as the required compensation circuit are well known to those skilled in the art, further description is omitted here for brevity.

Ideally, the clock timing delay between the quantizer clock signal CLK_1 and the DAC clock signal CLK_2' should be equal to one period; in other words, due to one period delay, the phase of the quantizer clock signal CLK_1 should be aligned with the phase of the DAC clock signal CLK_2'. However, in an actual implementation, such a clock timing requirement of the quantizer clock signal CLK_1 and the DAC clock signal CLK_2' would necessitate the circuit elements included in the conventional continuous-time delta-sigma ADC to have critical circuit performance. For example, the bandwidth of the adder 202 should be as high as possible, and the intrinsic delay of the DAC 108 should be as small as possible. Under such a scenario, the circuit components in the conventional continuous-time delta-sigma ADC generally have high current consumption.

SUMMARY OF THE INVENTION

In accordance with exemplary embodiments of the present invention, the present invention provides a clock timing calibration and clock timing calibration method for calibrating a phase difference between different clock signals (e.g., clock signals of a quantizer and digital-to-analog converters included in a continuous-time delta-sigma analog-to-digital converter) and related analog-to-digital conversion system using the same.

According to one aspect of the present invention, a clock timing calibration circuit for calibrating a phase difference between a first clock signal and a second clock signal is disclosed. The clock timing calibration circuit includes a clock timing adjusting unit and a calibration control unit. The clock timing adjusting unit is implemented for receiving an incoming reference clock signal and selectively adjusting the received reference clock signal to generate the first clock signal according to a calibration control signal. The incoming reference clock has a predetermined phase and a predetermined frequency. The calibration control unit is coupled to the clock timing adjusting unit, and is implemented for checking if the phase difference between the first clock signal and the second clock signal satisfies a predetermined criterion, and for adjusting the calibration control signal when the phase difference between the first clock signal and the second clock signal does not satisfy the predetermined criterion. The predetermined criterion is to check if the phase difference falls within a specific range associated with a clock period of one of the first clock signal and the second clock signal.

According to another aspect of the present invention, a clock timing calibration method for calibrating a phase difference between a first clock signal and a second clock signal is disclosed. The clock timing calibration method includes: receiving an incoming reference clock signal and generating the first clock signal according to the reference clock signal, wherein the incoming reference clock has a predetermined phase and a predetermined frequency; checking if the phase difference between the first clock signal and the second clock signal satisfies a predetermined criterion; and when the phase difference between the first clock signal and the second clock signal does not satisfy the predetermined criterion, adjusting the received reference clock signal to thereby adjust a timing of the first clock signal. The predetermined criterion is to check if the phase difference falls within a specific range associated with a clock period of one of the first clock signal and the second clock signal.

According to yet another aspect of the present invention, an analog-to-digital conversion system is disclosed. The analog-to-digital conversion system includes a continuous-time delta-sigma analog-to-digital converter (ADC) and a clock timing calibration circuit. The continuous-time delta-sigma ADC has a quantizer operated according to a first clock signal and a plurality of digital-to-analog converters operated according to a second clock signal. The clock timing calibration circuit is coupled to the continuous-time delta-sigma ADC, and is implemented for calibrating a phase difference between the first clock signal and the second clock signal. The clock timing calibration circuit includes a clock timing adjusting unit and a calibration control unit. The clock timing adjusting unit is implemented for receiving an incoming reference clock signal and selectively adjusting the received reference clock signal to generate the first clock signal according to a calibration control signal. The incoming reference clock has a predetermined phase and a predetermined frequency. The calibration control unit is coupled to the clock timing adjusting unit, and is implemented for checking if the phase difference between the first clock signal and the second clock signal satisfies a predetermined criterion, and for adjusting the calibration control signal when the phase difference between the first clock signal and the second clock signal does not satisfy the predetermined criterion. The predetermined criterion is to check if the phase difference falls within a specific range associated with a clock period of one of the first clock signal and the second clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
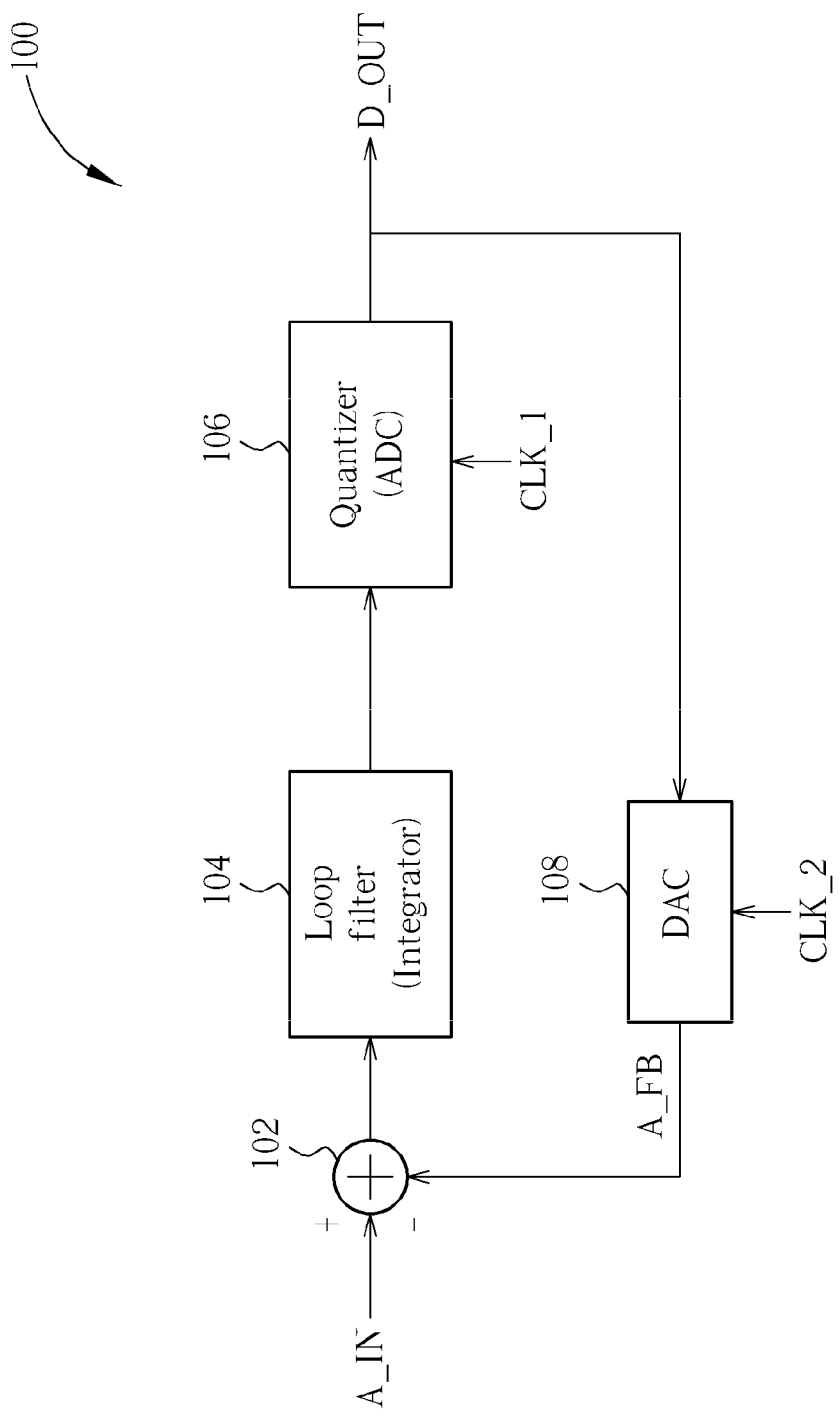
FIG. 1 is a diagram illustrating a conventional continuous-time delta-sigma analog-to-digital converter.
Figure 2:
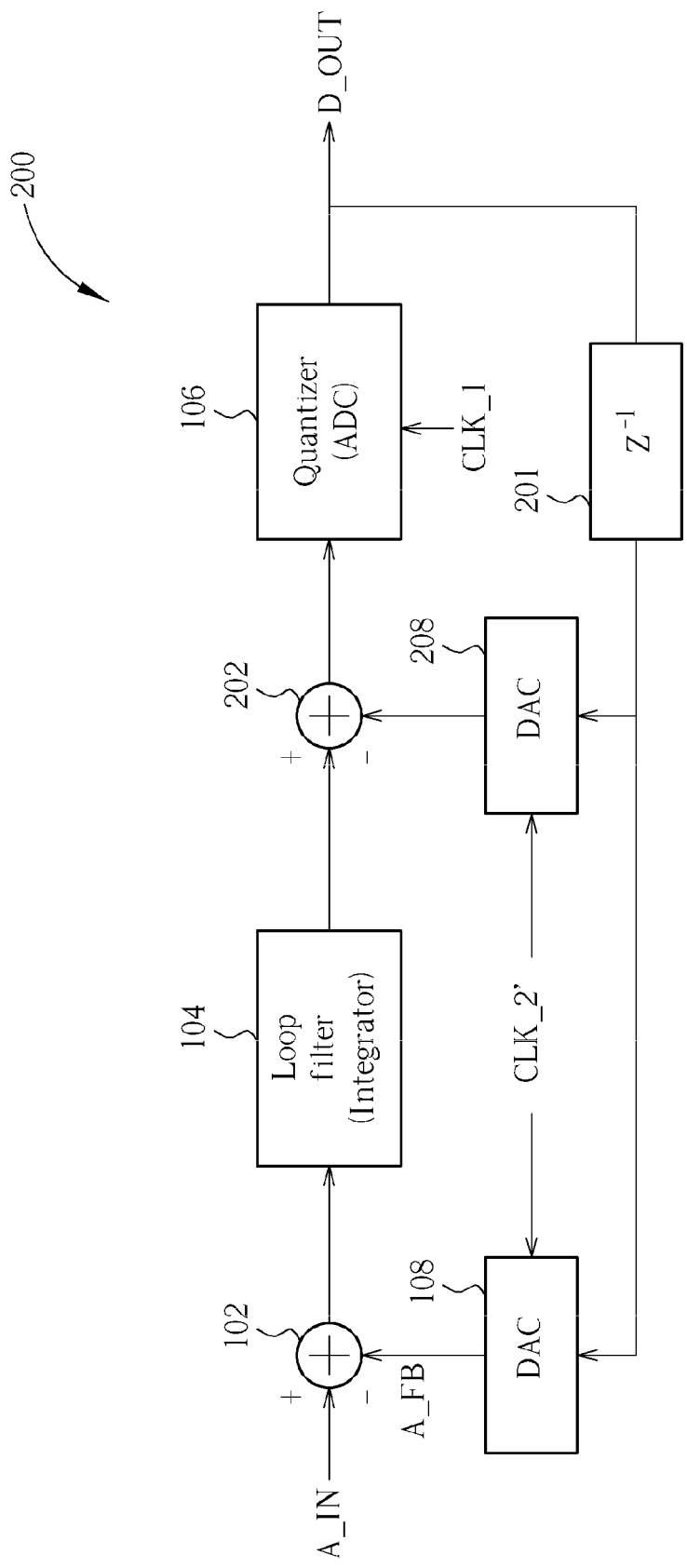
FIG. 2 is a diagram illustrating another conventional continuous-time delta-sigma analog-to-digital converter.
Figure 3:
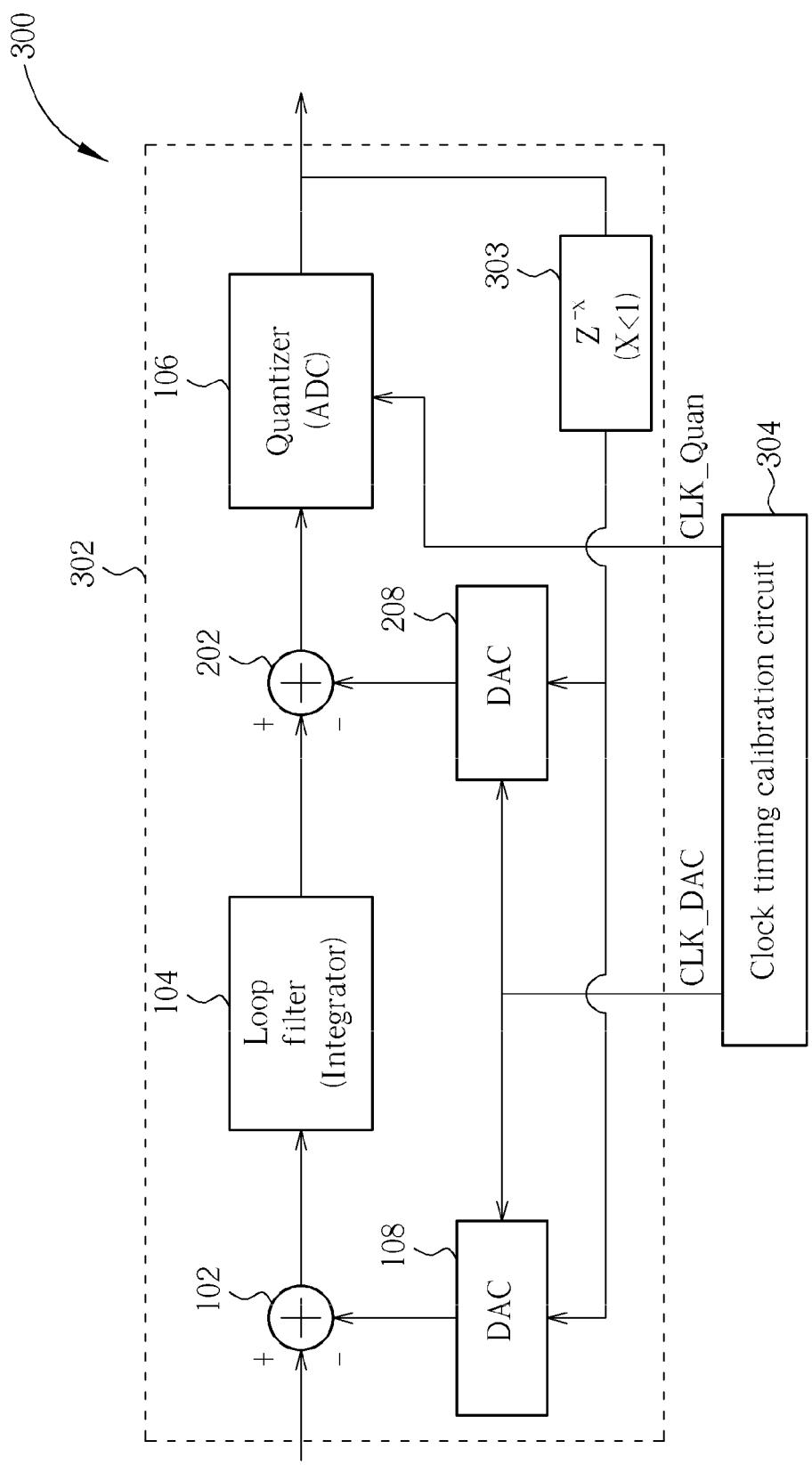
FIG. 3 is a diagram illustrating an analog-to-digital conversion system according to an exemplary embodiment of the present invention.
Figure 4:
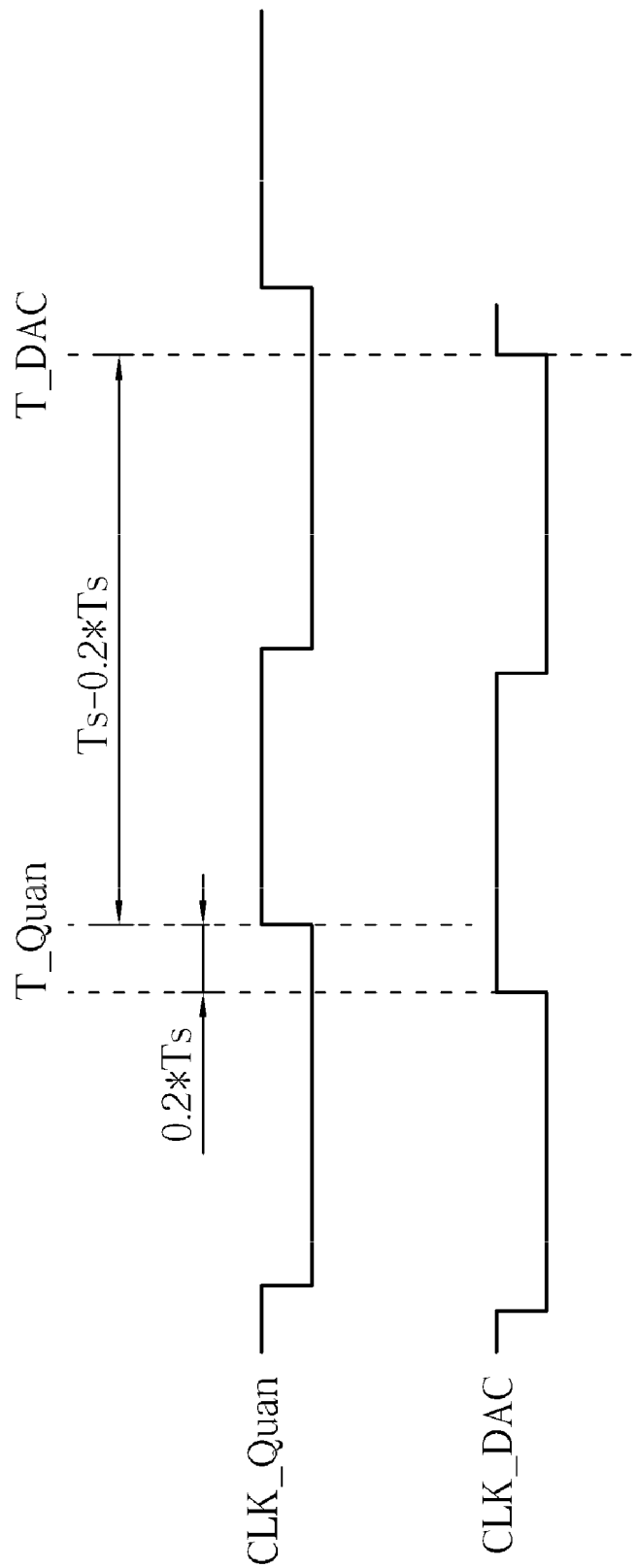
FIG. 4 is a timing diagram of a quantizer clock signal and a DAC clock signal.

To relax the effort on realizing the high-performance circuit components in the continuous-time delta-sigma ADC, the clock timing delay between the quantizer clock signal and the DAC clock signal is controlled to be smaller than one period. Please refer to FIG. 3, which is a diagram illustrating an analog-to-digital conversion system according to an exemplary embodiment of the present invention. The exemplary analog-to-digital conversion system 300 includes a continuous-time delta-sigma ADC 302 and a clock timing calibration circuit 304. The internal structure of the continuous-time delta-sigma ADC 302 is similar to that of the continuous-time delta-sigma ADC 200 shown in FIG. 2. The major difference, however, is that the conceptual feedback delay stage 301 included in the continuous-time delta-sigma ADC 302 is realized by delaying the quantizer clock timing with respect to the DAC clock timing by a fractional period (e.g., 0.2*Ts) which is shorter than one period (e.g., 1*Ts). In general, the total delay of the ADC loop should be kept at one period. For example, if the accumulated delay of the intrinsic delays caused by the loop filter 104, the adders 102, 202, the quantizer 106, and the DAC 108 is estimated to be 0.2*Ts, the timing of the quantizer clock signal CLK_Quan used by the quantizer 106 (i.e., T_Quan) is adjusted to be (1.0*Ts−0.2*Ts) leading the timing of the DAC clock signal CLK_DAC used by the DACs 108 and 208 (i.e., T_DAC). In other words, before the particular delay amount (e.g., 0.2*Ts) is applied to the quantizer clock signal CLK_Quan, the timing of the quantizer clock signal CLK_Quan should lead that of the DAC clock signal CLK_DAC by one period (e.g., 1*Ts); however, after the particular delay amount is applied to the quantizer clock signal CLK_Quan, the timing of the quantizer clock signal CLK_Quan leads that of the DAC clock signal CLK_DAC by 0.8*Ts rather than 1*Ts. The result is illustrated in FIG. 4. As one can see, with the implementation of the aforementioned particular delay amount (e.g., 0.2*Ts) applied to the quantizer clock signal CLK_Quan to make a phase difference between the DAC clock signal CLK_DAC and the quantizer clock signal CLK_Quan substantially become 0.8*Ts, the circuit performance of the circuit components is not required to be so critical, which reduces the current consumption accordingly.

To obtain the desired fractional period delay, using a clock source with higher clock rate or a multi-phase phase-locked loop (PLL) will require extra circuitry occupying a large area. In a case where an open-loop delay chain is implemented to obtain the desired fractional period delay by gate delays, the delay amount will drift due to process and/or temperature variation. The present invention therefore proposes using the novel clock timing calibration circuit 304 to ensure that the phase difference between the quantizer clock signal CLK_Quan and the DAC clock signal CLK_DAC satisfies the predetermined criterion. For example, the clock timing calibration circuit 304 calibrates the clock timing delay between the quantizer clock signal CLK_Quan and the DAC clock signal CLK_DAC each time an apparatus having the analog-to-digital conversion system 300 implemented therein is powered on.

Figure 5:
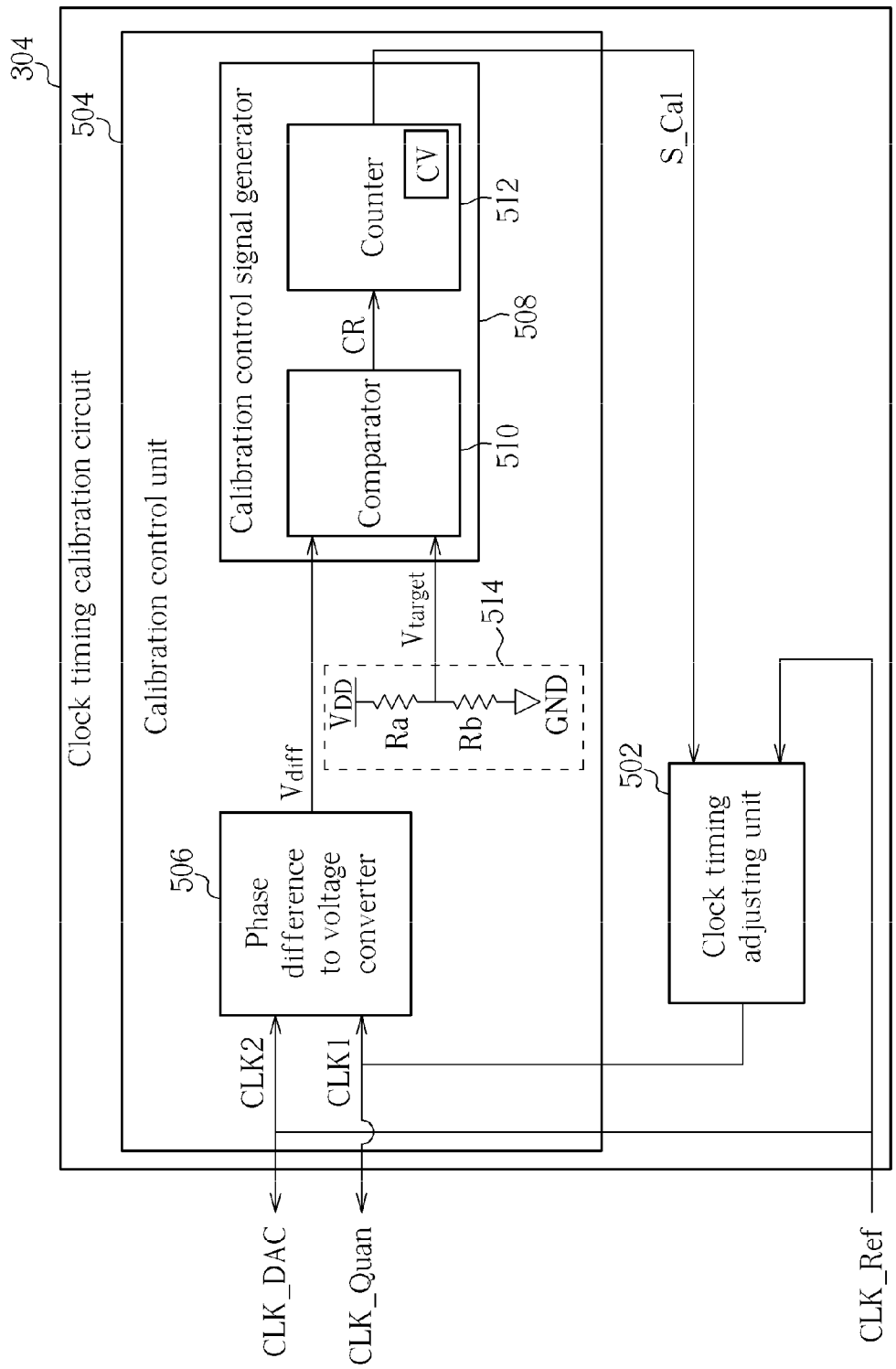
FIG. 5 is a diagram illustrating an exemplary implementation of a clock timing calibration circuit shown in FIG. 3.

FIG. 5 is a diagram illustrating an exemplary implementation of the clock timing calibration circuit 304 shown in FIG.

3. The exemplary clock timing calibration circuit 304 includes a clock timing adjusting unit 502 and a calibration control unit 504. The clock timing adjusting unit 502 is implemented for receiving an incoming reference clock signal CLK_Ref and selectively adjusting the received reference clock signal CLK_Ref to generate a first clock signal CLK1 (e.g., the quantizer clock signal CLK_Quan) according to a calibration control signal S_Cal. It should be noted that the incoming reference clock signal CLK_Ref has a predetermined phase and a predetermined frequency when originated from a clock source (not shown). The calibration control unit 504 is coupled to the clock timing adjusting unit 502, and is implemented for checking if the phase difference between the first clock signal CLK1 and a second clock signal CLK2 (e.g., the DAC clock signal CLK_DAC) satisfies a predetermined criterion, and for adjusting the calibration control signal S_Cal when the phase difference between the first clock signal CLK1 and the second clock signal CLK2 does not satisfy the predetermined criterion. More specifically, the predetermined criterion is to check if the phase difference falls within a specific range associated with a clock period of one of the first clock signal CLK1 and the second clock signal CLK2. In one exemplary implementation, the specific range referenced by the predetermined criterion is, for example, a certain range around a specific value (1.0*Ts–0.2*Ts) as mentioned above. As shown in FIG. 5, the reference clock signal CLK_Ref directly serves as the second clock signal CLK2, and the first clock signal CLK1 is generated from the reference clock signal CLK_Ref through the clock timing adjusting unit 502. However, this is for illustrative purposes only, and is not meant to be a limitation to the scope of the present invention. For example, in an alternative design, the first clock signal CLK1 and the second clock signal CLK2 can be derived from distinct clock sources with the same clock frequency.

Figure 6:
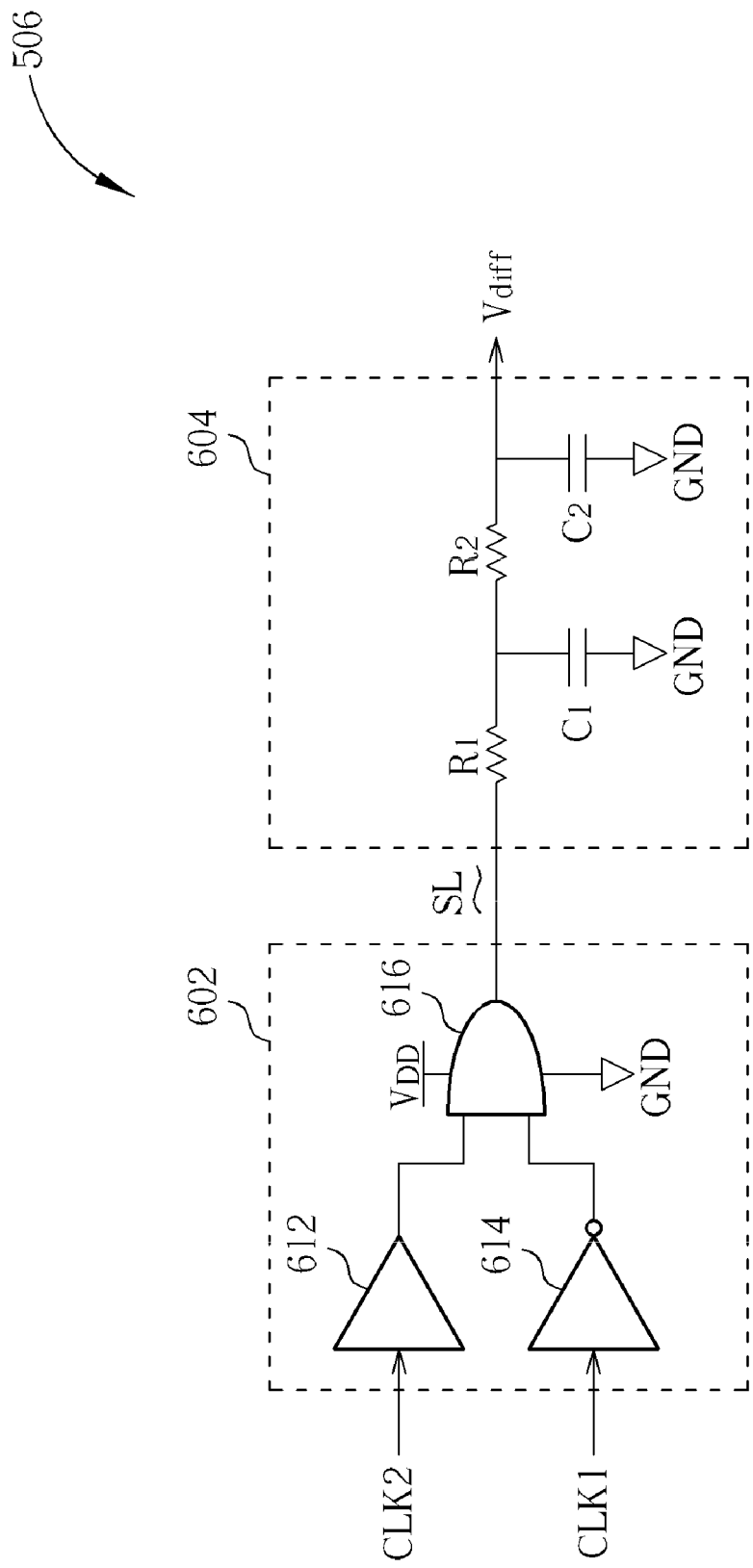
FIG. 6 is a diagram illustrating an exemplary implementation of a phase difference to voltage converter shown in FIG. 5.

The calibration control unit 504 includes a phase difference to voltage converter 506 which is implemented for converting the phase difference between the first clock signal CLK1 and the second clock signal CLK2 into an output voltage $V_{diff}$. Please refer to FIG. 6, which shows a diagram illustrating an exemplary implementation of the phase difference to voltage converter 506 shown in FIG. 5. In this exemplary implementation, the phase difference to voltage converter 506 includes a combination logic 602 and a low-pass filter 604. The combination logic 602 has a plurality of circuit elements, including a buffer 612, a NOT gate 614, and an AND gate 616, implemented therein for performing a specific combinational logic operation upon the first clock signal CLK1 and the second clock signal CLK2 to generate a logic output SL representative of the phase difference between the first clock signal CLK1 and the second clock signal CLK2. The low-pass filter 604 is implemented using an RC network including resistors R1, R2 and capacitors C1, C2, and performs a low-pass filtering operation upon the logic output SL generated from the preceding combination logic 602 to generate the aforementioned output voltage $V_{diff}$.

As shown in FIG. 5, the calibration control unit 504 further includes a calibration control signal generator 508 which is coupled to the phase difference to voltage converter 506, and is implemented for generating the calibration control signal S_Cal according to the output voltage $V_{diff}$ and a target voltage $V_{target}$. The calibration control signal generator 508 includes a comparator 510, and a counter 512. The comparator 510 is implemented for comparing the output voltage $V_{diff}$ and the target voltage $V_{target}$ to generate a comparison result CR. The counter 512 is coupled to the comparator, and is implemented for generating a counter value CV serving as the calibration control signal S_Cal according to the comparison result CR. Specifically, a counting operation of the counter 512 is active to update the counter value CV when the comparison result CR indicates that the output voltage $V_{diff}$ does not reach the target voltage $V_{target}$ yet; in addition, the counting operation of the counter 512 is disabled to hold the counter value CV when the comparison result CR indicates that the output voltage $V_{diff}$ reaches the target voltage $V_{target}$. In this exemplary implementation, the desired target voltage $V_{target}$ is simply derived using the voltage divider 514 included in the calibration control unit 504. The voltage divider 514 is implemented for dividing a reference voltage (e.g., the supply voltage VDD) to generate the target voltage $V_{target}$ according to a voltage dividing factor which is set according to the predetermined criterion of the phase difference between the first clock signal and the second cloak signal. As shown in FIG. 5, the voltage divider 514 includes a plurality of resistors $R_a$ and $R_b$, and the voltage dividing factor is therefore equal to $R_b/(R_a+R_b)$. Taking the timing diagram shown in FIG. 4 for example, the desired phase difference between the quantizer clock signal CLK_Quan and the DAC clock signal CLK_DAC is equal to 0.8*Ts. Therefore, as the phase difference to voltage converter 506 and the voltage divider 514 are operated under the same supply voltage VDD and the ground voltage GND, the target voltage $V_{target}$ is easily set by configuring the voltage dividing factor $R_b/(R_a+R_b)$ of the voltage divider 514 to be 0.8. That is, the target voltage $V_{target}$ is equal to 0.8*VDD under such an exemplary scenario. However, it should be noted that using a voltage divider to derive the target voltage $V_{target}$ is for illustrative purposes only, and is not meant to be a limitation to the scope of the present invention. In other words, other means capable of generating the desired target voltage $V_{target}$ can be employed by the exemplary calibration control signal generator 508 of the present invention.

The clock timing calibration circuit 304 is a closed-loop control system, and continuously adjusts the clock timing of the first clock signal CLK1 until the phase difference between the first clock signal CLK1 and the second clock signal CLK2 satisfies the predetermined criterion. More specifically, the clock timing adjusting unit 502 does not stop adjusting the clock timing of the first clock signal CLK1 until the output voltage $V_{diff}$ reaches the target voltage $V_{target}$, for example, $V_{diff} \geq V_{target}$. Further details of the clock timing adjusting unit 502 shown in FIG. 3 are illustrated as follows.

Figure 7:
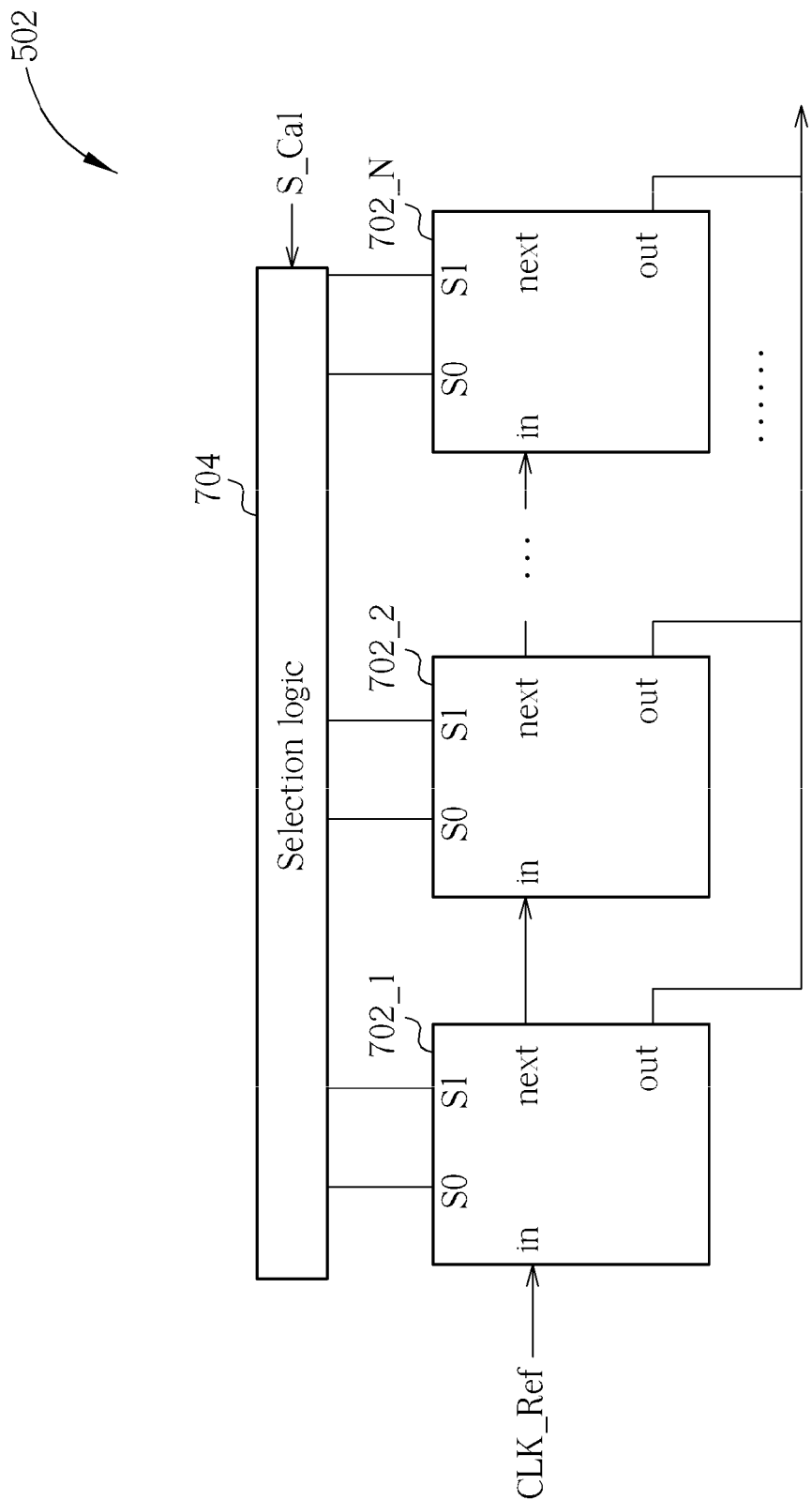
FIG. 7 is a diagram illustrating an exemplary implementation of a clock timing adjusting unit shown in FIG. 5.
Figure 8:
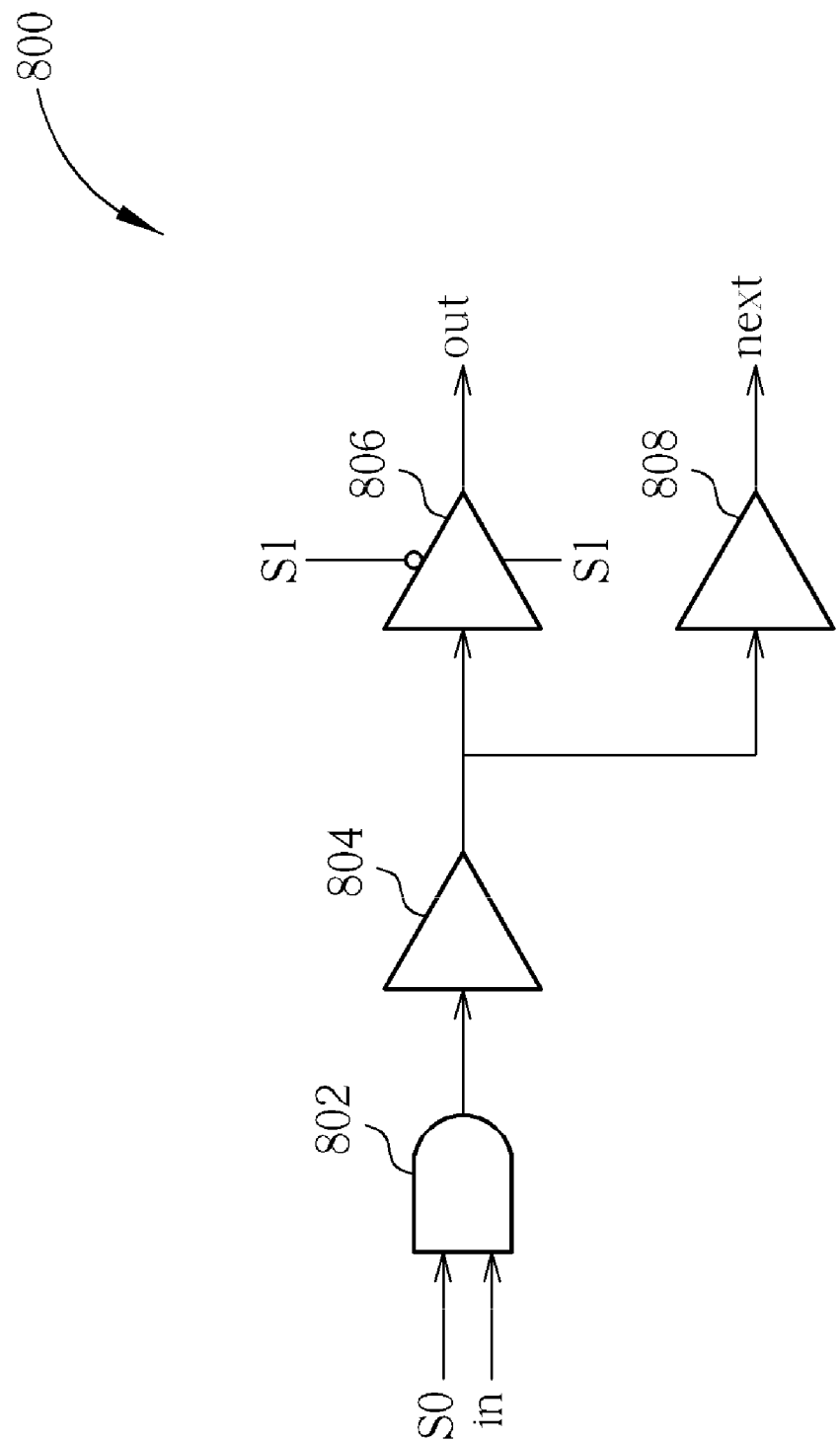
FIG. 8 is a diagram illustrating an exemplary implementation of a delay cell shown in FIG. 7.

FIG. 7 is a diagram illustrating an exemplary implementation of the clock timing adjusting unit 502 shown in FIG. 5. The clock timing adjusting unit 502 includes a plurality of delay cells 702_1, 702_2, . . . , 702_N connected in series, and a selection logic 704 coupled to all of the delay cells 702_1, 702_2, . . . , 702_N. Each of the delay cells 702_1, 702_2, . . . , 702_N is to apply a specific delay amount to a received input signal to generate an output signal, and the reference clock signal CLK_Ref is fed into a leading delay cell 702_1 of the cascaded delay cells 702_1, 702_2, . . . , 702_N. The selection logic 704 is used for referring to the calibration control signal S_Cal to select an output signal of a specific delay cell in the delay cells 702_1, 702_2, . . . , 702_N to serve as the first clock signal CLK1. Please refer to FIG. 8, which shows a diagram illustrating an exemplary implementation of the delay cell shown in FIG. 7. In one embodiment, the delay cells 702_1, 702_2, . . . , 702_N are controlled independently, and have the same structure illustrated in FIG. 8. The exemplary delay cell 800 includes an AND gate 802 and a plurality of buffers 804, 806, and 808. As one can see, the buffer 804 is a normal buffer; the buffer 806 is controlled by a control signal received at node S1 to be either enabled or disabled; and the buffer 808 is a normal buffer without enable control applied thereto so that the buffer 808 is always enabled to transmit whatever it receives to a following delay cell via the node "next". With proper setting of the control signal at node "S0", the delay cell 800 can be either enabled or disabled as the AND gate 802 functions as a clock gating component; besides, with proper setting of the control signal at node "S1", the enabled delay cell 800 can be configured to selectively output a delayed version of an input signal received at node "in" to the phase difference to voltage converter 506 via the node "out".

Figure 9:
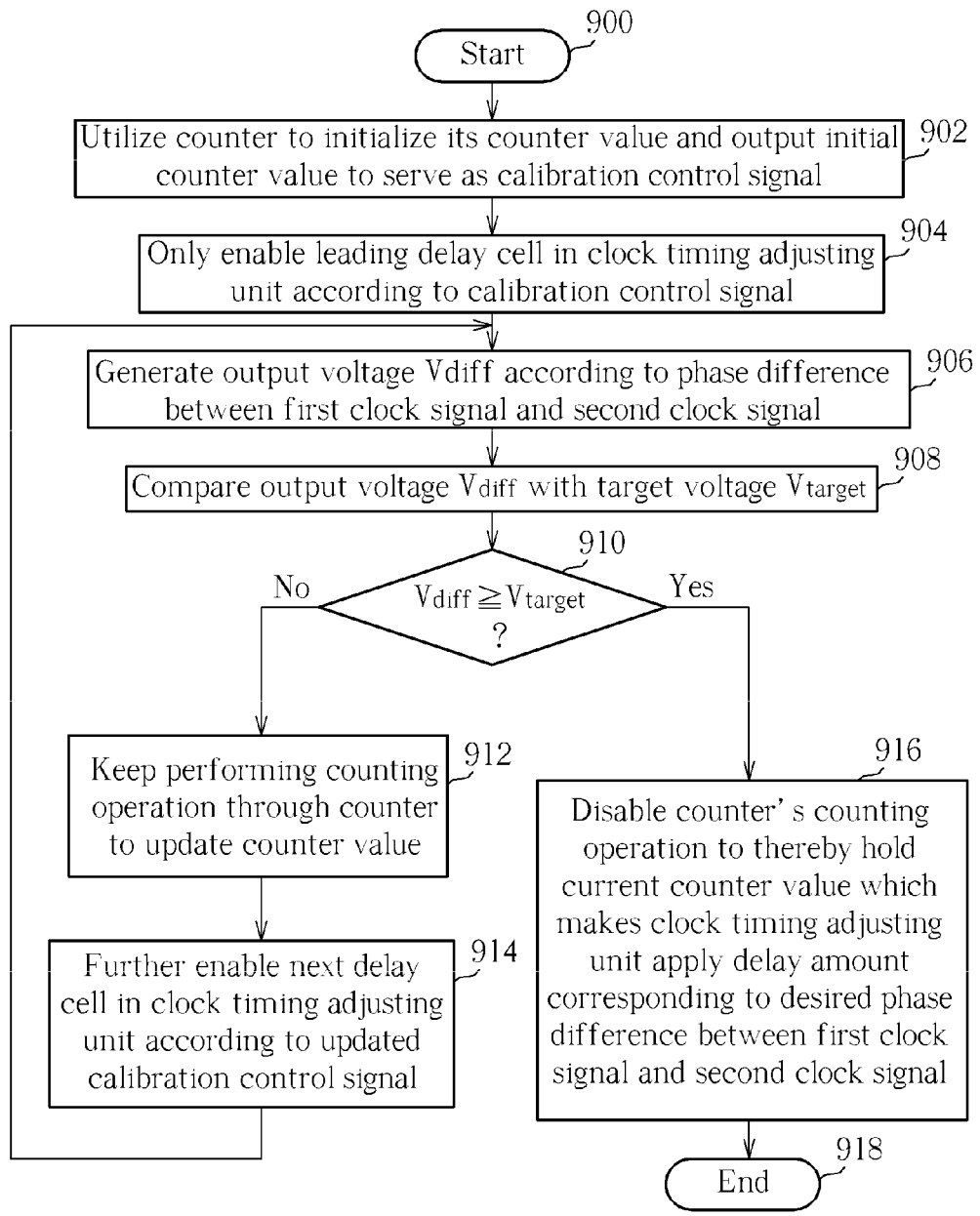
FIG. 9 is a flowchart illustrating a clock timing calibration method for calibrating a phase difference between different clock signals according to an exemplary embodiment of the present invention.

A clock timing calibration method employed by the clock timing calibration circuit 304 for calibrating a phase difference between the first clock signal CLK1 and the second clock signal CLK2 can be briefly summarized using the flow shown in FIG. 9. Please refer to FIG. 9 in conjunction with FIG. 3 and FIG. 7. Provided that the result is substantially the same, the steps are not required to be executed in the exact order shown in FIG. 9. The exemplary clock timing calibration method includes following steps:

Step 900: Start.

Step 902: The counter 512 is enabled, and then initializes the counter value CV to thereby output an initial counter value to serve as the calibration control signal S_Cal in the beginning.

Step 904: The selection logic 704 only enables the leading delay cell 702_1 of the delay cells included in the clock timing adjusting unit 502 according to the calibration control signal S_Cal, thereby making the clock timing adjusting unit 502 apply a minimum delay time to the reference clock signal CLK_Ref. The delay cell 702_1 receives the reference clock signal CLK_Ref at node "in", and then outputs the first clock signal CLK1 at node "out".

Step 906: The phase difference to voltage converter 506 generates the output voltage $V_{diff}$ according to the first clock signal CLK1 and the second clock signal CLK2.

Step 908: The comparator 510 compares the output voltage $V_{diff}$ with the target voltage $V_{target}$.

Step 910: Check if the output voltage $V_{diff}$ reaches the target voltage $V_{target}$ (i.e., $V_{diff} \geq V_{target}$). If yes, go to step 916; otherwise, go to step 912.

Step 912: The counter 512 keeps performing the counting operation to update the counter value CV, thereby adjusting the calibration control signal S_Cal accordingly. For example, the counter value CV is increased by an increment step such as one.

Step 914: The selection logic 704 further enables the next delay cell according to the updated calibration control signal S_Cal, thereby making the clock timing adjusting unit 502 apply an increased delay time to the reference clock signal CLK_Ref. Each enabled delay cell, which is not the last enabled delay cell, is configured to receive an input signal at node "in", and then output an output signal at node "next" to the next enabled delay cell; in addition, the last enabled delay cell is configured to receive an input signal at node "in", and then output the first clock signal CLK1 at node "out" to the phase difference to voltage converter 506. The flow proceeds with step 906.

Step 916: The counter 512 is disabled, thereby holding the current counter value CV which makes the clock timing adjusting unit 502 apply a delay amount corresponding to the desired phase difference between the first clock signal CLK1 and the second clock signal CLK2.

Step 918: End.

In this exemplary embodiment, the delay time provided by clock timing adjusting 502 is increased gradually, and the output voltage $V_{diff}$ is therefore increased to approach the target voltage $V_{target}$. Specifically, the cascaded delay cells included in the clock timing adjusting unit 502 will be enabled one by one until the phase difference between the first clock signal CLK1 and the second clock signal CLK2 satisfies a predetermined criterion. That is, when the output voltage $V_{diff}$ reaches the target voltage $V_{target}$ (e.g., $V_{diff}$ is greater than and very close to $V_{target}$, or $V_{diff}$ is substantially equal to $V_{target}$), this implies that the desired phase difference between the first clock signal CLK1 and the second clock signal CLK2 is acquired successfully.

As the DAC performance is more critical to the performance of the continuous-time delta-sigma ADC 302, the clock timing adjusting unit 502 in the aforementioned embodiment shown in FIG. 5 adjusts the clock timing of the quantizer clock signal CLK_Quan, rather than the DAC clock signal CLK_DAC. However, this by no means implies that the clock timing calibration circuit 304 is only allowed to delay the clock timing of the quantizer clock signal CLK_Quan to achieve the objective of tuning the phase difference between the quantizer clock signal CLK_Quan and the DAC clock signal CLK_DAC. Delaying the clock timing of the DAC clock signal CLK_DAC to achieve the same objective of tuning the phase difference between the quantizer clock signal CLK_Quan and the DAC clock signal CLK_DAC still obeys the spirit of the present invention. In short, adjusting at least one of the DAC quantizer clock signal CLK_Quan and the DAC clock signal CLK_DAC to calibrate the clock timing delay should be considered falling within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock timing calibration circuit for calibrating a phase difference between a first clock signal and a second clock signal, comprising:
    a clock timing adjusting unit, configured for receiving an incoming reference clock signal and selectively adjusting the received reference clock signal to generate the first clock signal according to a calibration control signal, wherein the incoming reference clock signal has a predetermined phase and a predetermined frequency; and
    a calibration control unit, coupled to the clock timing adjusting unit, for checking if the phase difference between the first clock signal and the second clock signal satisfies a predetermined criterion, and for adjusting the calibration control signal when the phase difference between the first clock signal and the second clock signal does not satisfy the predetermined criterion, wherein the predetermined criterion is to check if the phase difference between the first clock signal and the second clock signal falls within a specific range associated with a clock period of one of the first clock signal and the second clock signal.

2. The clock timing calibration circuit of claim 1, wherein the second clock signal is the reference clock signal.

3. The clock timing calibration circuit of claim 1, wherein the clock timing adjusting unit comprises:
    a plurality of delay cells connected in series, wherein each of the delay cells applies a specific delay amount to a received input signal to generate an output signal, and the reference clock signal is fed into a leading delay cell of the delay cells; and a selection logic, coupled to the delay cells, for referring to the calibration control signal to select an output signal of a specific delay cell to serve as the first clock signal.

4. The clock timing calibration circuit of claim 1, wherein the calibration control unit comprises:
   a phase difference to voltage converter, configured for converting the phase difference between the first clock signal and the second clock signal into an output voltage; and
   a calibration control signal generator, coupled to the phase difference to voltage converter, for generating the calibration control signal according to the output voltage and a target voltage.

5. The clock timing calibration circuit of claim 4, wherein the phase difference to voltage converter comprises:
   a combination logic, for performing a specific combinational logic operation upon the first clock signal and the second clock signal to generate a logic output corresponding to the phase difference between the first clock signal and the second clock signal; and
   a low-pass filter, coupled to the combination logic, for generating the output voltage according to the logic output.

6. The clock timing calibration circuit of claim 4, wherein the calibration control signal generator comprises:
   a comparator, for comparing the output voltage and the target voltage to generate a comparison result; and
   a counter, coupled to the comparator, for generating a counter value serving as the calibration control signal according to the comparison result.

7. The clock timing calibration circuit of claim 6, wherein a counting operation of the counter is active to update the counter value when the comparison result indicates that the output voltage does not reach the target voltage yet, and the counting operation of the counter is disabled to hold the counter value when the comparison result indicates that the output voltage reaches the target voltage.

8. The clock timing calibration circuit of claim 4, wherein the calibration control unit further comprises:
   a voltage divider, coupled to the calibration control signal generator, for dividing a reference voltage to generate the target voltage according to a voltage dividing factor which is set according to the predetermined criterion of the phase difference between the first clock signal and the second cloak signal.

9. A clock timing calibration method for calibrating a phase difference between a first clock signal and a second clock signal, comprising:
   receiving an incoming reference clock signal and generating the first clock signal according to the reference clock signal, wherein the incoming reference clock has a predetermined phase and a predetermined frequency;
   checking if the phase difference between the first clock signal and the second clock signal satisfies a predetermined criterion; and
   when the phase difference between the first clock signal and the second clock signal does not satisfy the predetermined criterion, adjusting the received reference clock signal to thereby adjust a timing of the first clock signal, wherein the predetermined criterion is to check if the phase difference between the first clock signal and the second clock signal falls within a specific range associated with a clock period of one of the first clock signal and the second clock signal.

10. The clock timing calibration method of claim 9, wherein the second clock signal is the reference clock signal.

11. The clock timing calibration method of claim 9, wherein adjusting the received reference clock signal to thereby adjust the timing of the first clock signal comprises:
   adjusting a total delay amount applied to the reference clock signal to thereby adjust the timing of the first clock signal.

12. The clock timing calibration method of claim 9, wherein checking if the phase difference between the first clock signal and the second clock signal satisfies the predetermined criterion comprises:
   converting the phase difference between the first clock signal and the second clock signal into an output voltage; and
   referring to the output voltage and a target voltage to check if the phase difference between the first clock signal and the second clock signal satisfies the predetermined criterion.

13. The clock timing calibration method of claim 12, wherein converting the phase difference between the first clock signal and the second clock signal into the output voltage comprises:
   performing a specific combinational logic operation upon the first clock signal and the second clock signal to generate a logic output corresponding to the phase difference between the first clock signal and the second clock signal; and
   performing a low-pass filtering operation upon the logic output to generate the output voltage.

14. The clock timing calibration method of claim 12, wherein:
   referring to the difference between the output voltage and the target voltage to check if the phase difference between the first clock signal and the second clock signal satisfies the predetermined criterion comprises:
     comparing the output voltage and the target voltage to generate a comparison result; and
     utilizing a counter to generate a counter value according to the comparison result; and
   adjusting the received reference clock signal to thereby adjust the timing of the first clock signal comprises:
     adjusting the received reference clock signal according to the counter value.

15. The clock timing calibration method of claim 14, wherein a counting operation of the counter is active to update the counter value when the comparison result indicates that the output voltage does not reach the target voltage yet, and the counting operation of the counter is disabled to hold the counter value when the comparison result indicates that the output voltage reaches the target voltage.

16. The clock timing calibration method of claim 12, wherein checking if the phase difference between the first clock signal and the second clock signal satisfies the predetermined criterion further comprises:
   setting a voltage dividing factor according to the predetermined criterion of the phase difference between the first clock signal and the second cloak signal; and
   dividing a reference voltage to generate the target voltage according to the voltage dividing factor.

17. An analog-to-digital conversion system, comprising:
   a continuous-time delta-sigma analog-to-digital converter (ADC), comprising a quantizer operated according to a quantizer clock signal and a plurality of digital-to-analog converters (DACs) operated according to a DAC clock signal; and
   a clock timing calibration circuit, coupled to the continuous-time delta-sigma ADC, for calibrating a phase difference between a first clock signal and a second clock signal, one of the first clock signal and the second clock signal being the quantizer clock signal, the other of the first clock signal and the second clock signal being the DAC clock signal, the clock timing calibration circuit comprising:
a clock timing adjusting unit, configured for receiving an incoming reference clock signal and selectively adjusting the received reference clock signal to generate the first clock signal according to a calibration control signal, wherein the incoming reference clock has a predetermined phase and a predetermined frequency; and
a calibration control unit, coupled to the clock timing adjusting unit, for checking if the phase difference between the first clock signal and the second clock signal satisfies a predetermined criterion, and for adjusting the calibration control signal when the phase difference between the first clock signal and the second clock signal does not satisfy the predetermined criterion, wherein the predetermined criterion is to check if the phase difference between the first clock signal and the second clock signal falls within a specific range associated with a clock period of one of the first clock signal and the second clock signal.

18. The analog-to-digital conversion system of claim 17, wherein the first clock signal is the quantizer clock signal, and the second clock signal is the DAC clock signal.

* * * * *